(12) United States Patent
Kanitz

(10) Patent No.: US 7,947,975 B2
(45) Date of Patent: May 24, 2011

(54) MATERIALS FOR IMPROVING THE HOLE INJECTION IN ORGANIC ELECTRONIC DEVICES AND USE OF THE MATERIAL

(75) Inventor: Andreas Kanitz, Hoechstadt (DE)

(73) Assignee: Osram Opto Semiconductors GmbH, Regensburg (DE)

(*) Notice: Subject to any disclaimer, the term of this patent is extended or adjusted under 35 U.S.C. 154(b) by 212 days.

(21) Appl. No.: 12/065,814

(22) PCT Filed: Aug. 28, 2006

(86) PCT No.: PCT/EP2006/065726
§ 371 (c)(1),
(2), (4) Date: Sep. 10, 2008

(87) PCT Pub. No.: WO2007/028733
PCT Pub. Date: Mar. 15, 2007

(65) Prior Publication Data
US 2009/0152535 A1    Jun. 18, 2009

(30) Foreign Application Priority Data

Sep. 5, 2005 (DE) .................. 10 2005 042 105

(51) Int. Cl.
H01L 51/00 (2006.01)
H01B 1/02 (2006.01)
C07D 303/02 (2006.01)
C07C 211/00 (2006.01)

(52) U.S. Cl. ....... 257/40; 252/521.6; 549/550; 564/330; 257/E51.028

(58) Field of Classification Search .......... 257/40, 257/E51.028; 544/392; 562/445; 654/227, 654/330; 549/550; 252/526.6
See application file for complete search history.

(56) References Cited

U.S. PATENT DOCUMENTS 5,089,168 A * 2/1992 Krause et al. ............ 252/299.61
2005/0139810 A1   6/2005 Kuehl et al.
2006/0237368 A1 * 10/2006 Marks et al. ................... 210/656

FOREIGN PATENT DOCUMENTS

EP       0 941 990 A2    9/1999
WO       WO 95/29958 A1  11/1995
WO       WO 02/12212 A1   2/2002

OTHER PUBLICATIONS

J. Blochwitz et al., "Non-polymeric OLEDs with a doped amorphous hole transport layer and operating voltages down to 3.2 V to achieve 100 cd/m2", Synthetic Metals, vol. 127, (2002),Elsevier Science B.V., pp. 169-173.*
D. Gebeyehu et al., "Highly efficient p-i-n organic photovoltaic devices", Thin Solid Films, vol. 451-452, Elsevier B.V. (2004), pp. 39-32.*
Gufeng He et al., "High-efficiency and low-voltage *p-i-n* electrophosphorescent organic light-emitting diodes with double-emission layers", Oct. 25, 2004, Applied Physics Letters, vol. 85, No. 17, pp. 3911-3913.
Koji Yui et al., "Novel Electron Acceptors Bearing Heteroquinonoid System. I. Synthesis and Conductive Complexes of 5,5'—Bis(dicyanomethylene)-5,5'-dihydro-$\Delta^{2,2'}$-bithiophene and Related Compounds", May 1989, The Chemical Society of Japan, vol. 62, No. 5, pp. 1539-1546.
M. Pfeiffer et al., "Doped organic semiconductors: Physics and application in light emitting diodes", 2003, Organic Electronics, vol. 4, No. 2/3, pp. 89-103.
M.C. Ruiz Delgado et al., "Vibrational dynamics study of the effect of the substituents on the π-conjugation of different bithiophene molecules", 2005, Journal of Molecular Structure 744-747, pp. 393-401.

* cited by examiner

Primary Examiner — W. David Coleman
(74) Attorney, Agent, or Firm — Fish & Richardson P.C.

(57) ABSTRACT

A dopant composition for organic semiconductors is an electron acceptor characterized by an evaporation point above 150° C. or a glass phase. The dopant composition includes a compound represented by structural formula (1):

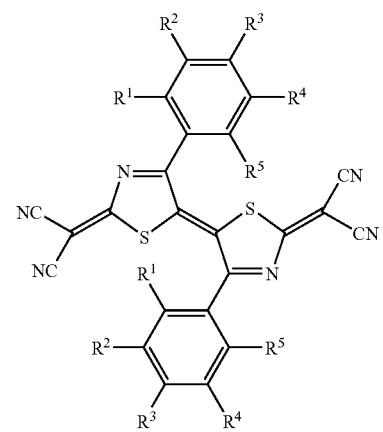

wherein $R^1$ to $R^5$ are independently hydrogen, chlorine, fluorine, nitro, or cyano; or a phenyl or annulated aromatic group optionally substituted with chlorine or fluorine. Also included are doped organic semiconductors and organic electronic components comprising the dopant composition, and methods of preparing the doped organic semiconductor.

12 Claims, No Drawings

MATERIALS FOR IMPROVING THE HOLE INJECTION IN ORGANIC ELECTRONIC DEVICES AND USE OF THE MATERIAL

TECHNICAL FIELD

The invention pertains to new materials for the enhancement of hole injection and hole transport in organic components like organic light-emitting diodes (OLED's), organic field-effect transistors (OFET's), and organic solar cells.

BACKGROUND

In recent years, materials have become known—especially for organic light-emitting diodes—which significantly improve hole injection as well as hole transport in OLED's. (Lit.: Gufeng He, Martin Pfeiffer, Karl Leo, Appl. Phys. Lett. 85 (2004) 3911-3913).

This also lowers the operating voltage without affecting the efficiency of the OLED. These materials are strong electron acceptors doped in low quantities in the hole transporting layer of the OLED. Such additions facilitate the oxidation of the hole transporting material (i.e. the formation of holes), which otherwise is caused by the energy of the electrical field only. Hence, a weaker electric field (corresponding to a lower operating voltage) provides the same efficiency.

The drawbacks of this method for improved hole transport (also called p-doping) are the physical properties of the usable materials during the deposition process. These materials are fluorinated tetra-cyano-chinodimethanes, whose volatility is very difficult to control, so that these types of doping materials cannot be used in mass production since the material would contaminate the system due to uncontrollable distribution.

SUMMARY

It is therefore the objective of this invention to create a material for improved hole injection in organic semiconductors which overcomes the drawbacks of the current state of the art, in particular the poor controllability of the known materials in the deposition process.

The solution to this problem and object of the invention are disclosed in the claims, the embodiments and the description.

DETAILED DESCRIPTION

Proposed are acceptor materials with higher evaporation points and/or glass-forming properties, which therefore evaporate in a controlled manner. Materials with glass-forming properties are amorphous and, due to the absence of crystallinity, ensure the removal of grain boundaries within the material, which in addition provides an energetically more favorable transfer of electrons and holes between the hole transporting material and the p-doping material. The higher evaporation point allows the controlled vaporization of the materials.

The described required properties can be achieved with heterocyclic chinodimethane derivatives represented by structural formula (1):

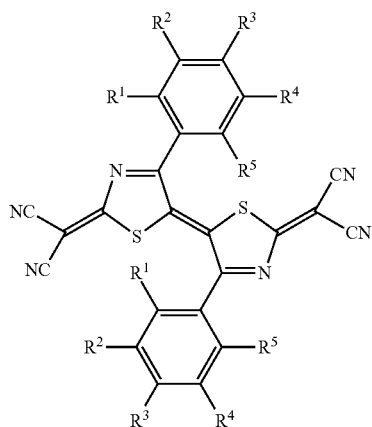

The substituents $R^1$ to $R^5$ stand independently of each other for hydrogen, chlorine, fluorine, a nitro group and/or a cyano-moiety.

$R^1$ to $R^5$ may furthermore be substituted independently of each other by phenyl substituents and/or structural elements generating annelated aromatic substituents, which peripherally may include in addition to hydrogen also chlorine and/or fluorine substituents.

General Method of Synthesis:

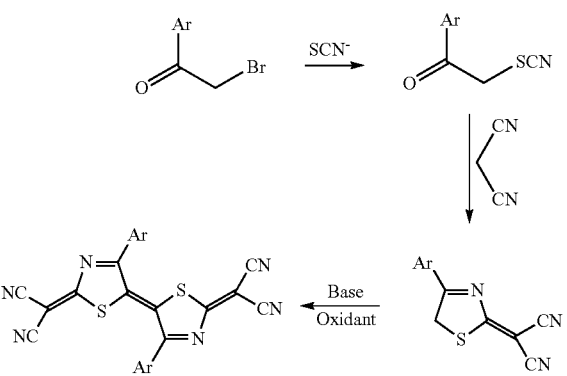

The compounds are synthesized from the respective 2-dicyanomethylene-4-aryl-substituted thiazolines by oxidative coupling.

The new materials capable of improving hole transport and hole injection due to chemical interaction with any hole transporting layer can therefore successfully be used universally in polymer-electronic components (also known as organic electronic components), which means primarily in any technologies for the manufacture of organic light-emitting diodes (OLED's), organic field effect transistors (OFET's) and/or organic photovoltaic technologies like organic solar cells.

The results are organic electronic components with a hole transporting layer doped or spiked with a material for the improvement of the hole transporting properties.

The quantities in which these materials are added vary according to the base material. Overall, the material is doped with the usual quantities. See also the disclosure to the state of the art in the Background section at the beginning of this document.

Embodiments

1. Bromination of the Arylmethyl Ketones

The respective arylmethyl ketone is brominated with bromine in glacial ethanoic acid.

2. Synthesis of the Arylacylrhodanides

The bromomethyl-arylketone according to 1.) is converted with the use of potassium rhodanide in boiling ethanol to form the respective arylacylrhodanide.

3. Synthesis of the 2-dicyanomethylene-4-aryl-thiazolines

The arylacylrhodanide according to 2.) is converted with malonic acid dinitrile and triethylamine in boiling ethanol into the corresponding thiazoline derivative.

4. Synthesis of the 4,4'diaryl-quino-5,5'-bisthiazolyl-2,2'-dicyanodimethanes (1)

The respective thiazoline derivative according to 3.) is deprotonated with butyl lithium at −70° C. and then oxidized with an oxidant (e.g. $CuCl_2$) into the desired 4,4'diaryl-quino-5,5'-bisthiazolyl-2,2'-dicyanodimethane (1).

The invention claimed is:

1. A material for doping of a hole transporting layer of an organic electronic component, comprising:
    a compound that exhibits a combination of acceptor properties with an evaporating point above 150° C. and glass-formation properties, said compound being represented by structural formula (1)

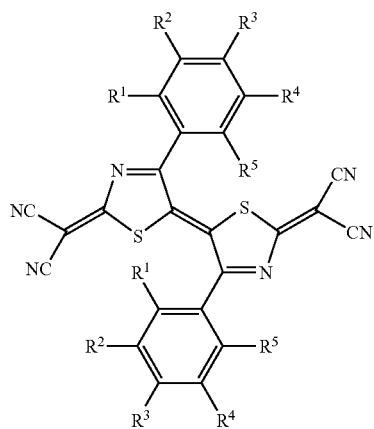

wherein the substituents $R^1$ to $R^5$ can be selected independently of each other and represent hydrogen, chlorine, fluorine, a nitro-group or a cyano moiety, or
the substituents $R^1$ to $R^5$ are substituted independently of each other by phenyl substituents or structural elements forming annelated aromatic substituents, which in their periphery optionally include chlorine or fluorine substituents.

2. A method of preparing an organic electronic component, comprising:
    doping a hole transporting layer of the organic electronic component with a material according to claim 1.

3. An organic electronic component, comprising:
    at least two electrodes separated by an active layer; and
    a hole transporting layer between at least one electrode and the active layer, wherein the hole transporting layer is doped with a material according to claim 1.

4. A dopant composition, comprising a compound represented by structural formula (1):

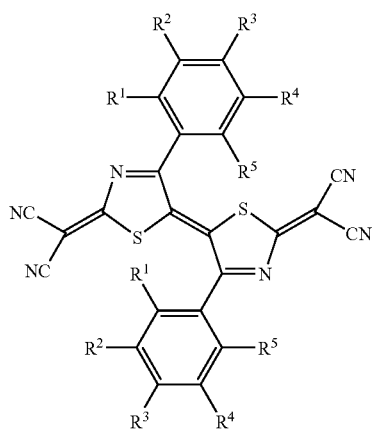

wherein $R^1$ to $R^5$ are independently hydrogen, chlorine, fluorine, nitro, or cyano; or a phenyl or annulated aromatic group optionally substituted with chlorine or fluorine.

5. The dopant composition of claim 4, wherein $R^1$ to $R^5$ are independently hydrogen, chlorine, fluorine, nitro, or cyano; or a phenyl optionally substituted with chlorine or fluorine.

6. The dopant composition of claim 4, wherein the compound represented by structural formula (1) is an electron acceptor.

7. A method of preparing an organic electronic component, comprising:
    providing a hole transport layer of the organic electronic component; and
    contacting the hole transport layer with a dopant composition according to claim 4.

8. An organic electronic component, comprising:
    at least two electrodes separated by an active layer, and
    a hole transporting layer between at least one of the electrodes and the active layer,
    wherein the hole transporting layer comprises a dopant composition according to claim 4.

9. The dopant composition of claim 6, characterized by an evaporation point above 150° C.

10. The dopant composition of claim 6, characterized by a glass phase.

11. The organic electronic component of claim 8, wherein the organic electronic component is an organic light-emitting diode (OLED), an organic field effect transistor (OFET), or a photovoltaic organic component.

12. The organic electronic component of claim 8, wherein the organic electronic component is an organic solar cell.

* * * * *

UNITED STATES PATENT AND TRADEMARK OFFICE
CERTIFICATE OF CORRECTION

| | | |
|---|---|---|
| PATENT NO. | : 7,947,975 B2 | Page 1 of 1 |
| APPLICATION NO. | : 12/065814 | |
| DATED | : May 24, 2011 | |
| INVENTOR(S) | : Andreas Kanitz | |

It is certified that error appears in the above-identified patent and that said Letters Patent is hereby corrected as shown below:

Title page, Item (56) In Other Publications, line 7, delete "pp. 39-32.*" and insert -- pp. 29-32.* --.

Title page, Item (56) In Other Publications, line 14, delete "$\Delta^{2.2'}$" and insert -- $\Delta^{2,2'}$ --, therefor.

Col. 3, line 25, In Claim 1, delete "150° C." and insert -- 150° C --, therefor.

Col. 3, line 27, In Claim 1, after "formula (1)", insert -- : --.

Col. 3, line 53, In Claim 1, delete "annelated" and insert -- annulated --, therefor.

Signed and Sealed this
Twenty-second Day of November, 2011

David J. Kappos
*Director of the United States Patent and Trademark Office*